United States Patent [19]
Walters et al.

[11] Patent Number: 4,629,957
[45] Date of Patent: Dec. 16, 1986

[54] SENSING APPARATUS

[75] Inventors: Peter E. Walters, London; Anthony M. Williams, Iver, both of England

[73] Assignee: EMI Limited, Hayes, England

[21] Appl. No.: 714,922

[22] Filed: Mar. 22, 1985

[30] Foreign Application Priority Data

Mar. 27, 1984 [GB] United Kingdom ............... 8407847

[51] Int. Cl.⁴ .............................................. G05B 1/06
[52] U.S. Cl. ...................................... 318/662; 73/651; 357/26
[58] Field of Search ............... 318/662; 357/26, 23.15; 901/45, 46

[56] References Cited

U.S. PATENT DOCUMENTS

| | | | |
|---|---|---|---|
| 714,923 | 12/1902 | Kember et al. ........................ | 238/6 |
| 4,035,822 | 7/1977 | Vilkomerson ......................... | 357/26 |
| 4,397,188 | 8/1983 | Bansevichus ......................... | 73/651 |

FOREIGN PATENT DOCUMENTS 0068899 1/1983 European Pat. Off. .

*Primary Examiner*—William M. Shoop, Jr.
*Assistant Examiner*—Saul M. Bergmann
*Attorney, Agent, or Firm*—Fleit, Jacobson, Cohn & Price

[57] ABSTRACT

A sensing apparatus has a probe displacement with respect to a support arm and to a reference position. The probe has a flat disc mounting three transducers which are spaced apart from one another at regular intervals. Each transducer has an elastomeric dielectric and is capable of producing an electrical output signal in response to displacement of the probe from the reference position. An electrical circuit compares output signals produced by the transducers and evaluates the direction and/or extent of probe displacement. Such evaluation may be used in the manipulator control system of an article-handling equipment.

10 Claims, 6 Drawing Figures

SENSING APPARATUS

The present invention relates to sensing apparatus, particularly but not exclusively apparatus for use with article-handling equipment, for example programmable manipulators.

The present invention provides a sensing apparatus comprising a probe, displaceable with respect to a support and to a reference position in response to contact with an article,
  and three or more transducers arranged in spaced apart relationship between the support and the probe,
  wherein each said transducer has an elastomeric dielectric and is capable of producing an electrical signal in response to a force acting on it, as occasioned by a displacement of the probe from the reference position.

In this way, the sensing apparatus may have increased sensitivity to displacement of the probe from the reference location as compared to conventional devices.

Preferably, the transducers are connected to a common surface of the probe remote from the reference location; advantageously the common surface is a flat plane which is perpendicular to, or inclined to, the longitudinal axis of the probe. Moreover the transducers are preferably spaced well apart over the common surface; for example these transducers may be arranged over a flat common surface in order to define an equilateral triangle of substantially the maximum dimensions possible for that surface. These preferred features contribute towards maximising the relative movement between probe and support at the transducers (and hence maximising their outputs) for a given displacement of probe from the reference location; moreover they contribute towards ensuring that the response characteristics of the device does not vary significantly according to direction of probe displacement.

The sensing apparatus may also have means to compare the outputs of the transducers in order to determine the direction of probe displacement from the reference location.

The sensing apparatus may have means to allow for movement of the probe in a direction parallel to its longitudinal axis. For example the sensing apparatus may have biassing means to urge the probe, when displaced, back towards the reference location, and that part of the support, on which the transducers are mounted, may be situated intermediate the common surface and the free end of the probe. Preferably, movement of the probe in the longitudinal axis direction is effective on the indication means and/or the comparison means.

According to another aspect, the present invention provides article-handling equipment comprising a work-station at which an article can be held, sensing apparatus comprising a probe movable relative to a support and about a reference location, three or more capacitative transducers with elastomeric dielectrics, the transducers being connected between the probe and the support at spaced-apart positions whereby each transducer is sensitive to forces between the probe and support at that position, and means to produce relative movement between the article and the probe in dependence on the transducer output(s).

Preferably the equipment has means to derive, from the transducer outputs, one or more signals for input to control means of the equipment in order to effect such relative movement between the article and probe.

In this way, when the probe is displaced from the reference location by an article, the transducer outputs can be used to produce a compensating movement so that the probe returns to the reference location; once this has been achieved, the position of that section of the article is known precisely.

According to a further aspect, the present invention provides sensing apparatus comprising a probe movable relative to a support and about a reference location, three or more capacitative transducers with elastomeric dielectrics, the transducers being connected between the probe and the support at spaced-apart positions whereby each transducer is sensitive to forces between the probe and support at that position, and means to derive, from the transducer outputs, one or more electrical signals to effect control of an electrical appliance in dependence on displacement of the probe.

In this way, the sensing apparatus can be used as a position controller of an electrical appliance, for example as a joystick for a video games unit.

According to a yet further aspect, the present invention provides apparatus for sensing the position of a probe with respect to a reference location, the apparatus comprising a probe movable relative to a support and about a reference location, three or more capacitive transducers with elastomeric dielectrics, the transducers being connected between the probe and the support at spaced-apart positions whereby each transducer is sensitive to forces between the probe and the support at that position, and means to compare the outputs of the transducers in order to determine the amount and direction of displacement of the probe from the reference location.

Thus, when such apparatus is used in article-handling equipment, the apparatus enables the position of the probe, and hence that of the article responsible for the probe's displacement, to be known. This information can be used to provide compensating alterations of the operations and actions of the equipment.

Article-handling equipment may use any of the forms of sensing apparatus described above on a movable arm in order to determine the geometrical co-ordinates, at one or more points, of an article which is stationary at a workstation on the equipment; the equipment can then use this information to measure the position of the article and/or to determine its shape (for example by comparing the measured values with a store of known shapes). Alternatively, the sensing apparatus may be permanently situated at a specific workstation of the equipment which has a movable arm to hold the article and the manoeuvre it around the sensing apparatus. Clearly one piece of article-handling equipment can utilize both applications of the sensing apparatus.

In order that the invention may more readily be understood, a description is now given, by way of example only, reference being made to the accompanying drawings in which.

Figure 1:
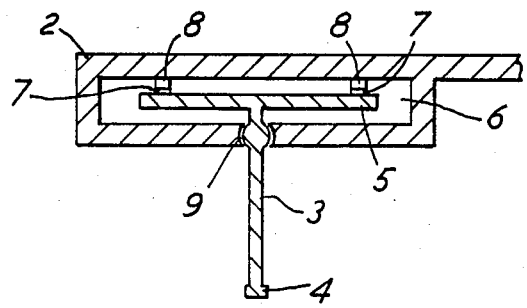
FIG. 1 is a cross-sectional view of one form of sensing apparatus embodying the present invention.
Figure 1:
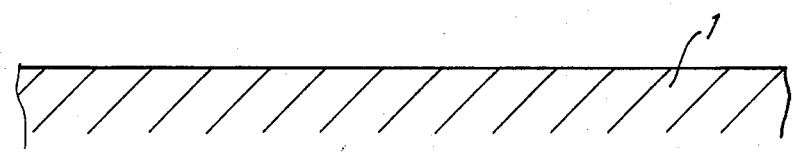

FIG. 1 shows part of a programmable manipulator for assembling components; the manipulator includes a work-station 1, on which a component is situated during one stage of the assembly process, and a movable measuring arm 2 which holds a probe 3 having at its free end an enlarged portion 4. In the measurement procedure, it is the enlarged portion 4 which is made to abut against the component.

Probe 3 has, at its end remote from portion 4, a flat disc 5 which is permanently located in an enclosed space 6 within arm 2. Four solid-state capacitative displacement transducers 7 (of which only two can be seen in the view shown) are located between disc 5 and the upper face of space 6, each transducer being situated on a resiliently deformable mounting block 8 which accommodates most of the changes in the separation between disc 5 and arm 2. Each transducer is sensitive to forces between the disc 5 and the arm 2 and thereby monitors the relative spacing therebetween. The four transducers 7 are positioned over the disc 5 such as to define the four corners of a square of the maximum dimension that would fit on the disc. By utilizing a number of transducers which are well spaced apart, the sensitivity of the equipment is maximised, and its response to a given displacement is uniform regardless of the direction of impulse.

Probe 3 is pivotably held on arm 2 by means of a ball-and-socket arrangement 9 which allows any point on the probe to move in a horizontal plane. The reference location (or stable, null position) of the probe is defined as that in which the longitudinal axis of the probe is vertical; when the probe is in this position, i.e. with no lateral force acting on it, there is no electrical output from any of the transducers 7. However any horizontal force on the probe 3 which rotates it relative to arm 2 will vary the spacing between disc 5 and the upper surface of space 6, resulting in one or more of the transducers 7 producing an electrical output.

The transducers are connected into an electrical circuit which operates such that an electrical output from any one or more transducers activates an indicator lamp, to show that displacement of probe 3 is occurring, and also sends a signal to the manipulator control system instructing it to initiate a pre-ordained pattern of movement (for example an increasing spiral motion) to find that position of component and probe in which they abut without any substantial force being applied. Clearly this searching motion could be achieved by moving either the probe or the component.

In a modification to the equipment described above, the electrical circuit operates such that the output signals from the transducers 7 are used to derive one or more signals for the manipulator control system instructing it to produce a compensating displacement between the probe and the component. Clearly, this could involve movement of the component by the same amount, but in the opposite direction to, the original displacement; alternatively it could involve movement of the arm 2 by the same amount, and in the same direction as, the original displacement.

In an additional or alternative modification, the electrical circuit operates such that the output signals from the transducers are measured and then compared, the resultant information being processed to determine the amount, and direction, of displacement of the probe. Thereafter, combining these results with the known position of the probe in its reference location (i.e. before the displacement), the manipulator can readily calculate the instantaneous position of the probe.

Figure 2:
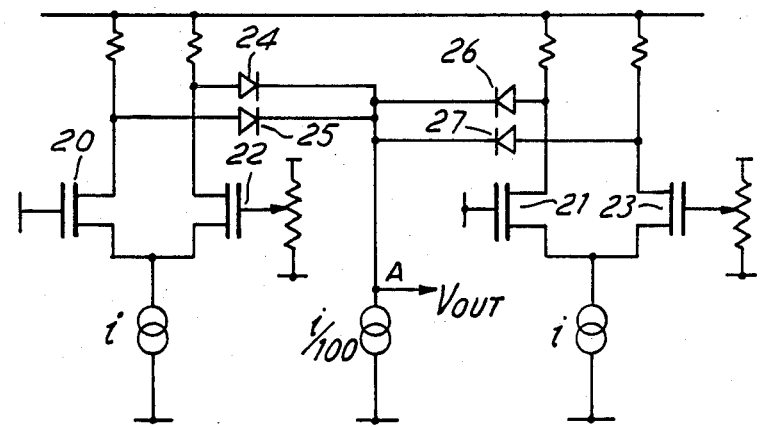
FIG. 2 is a diagram of an electric circuit for use with the apparatus of FIG. 1.

One form of electrical circuit suitable for use with the apparatus of FIG. 1 is shown in FIG. 2, in which four MISFETs 20, 21, 22 and 23, each with an elastomeric dielectric layer, are used as the transducers. The MISFETs are connected together in the electric circuit as differential pairs of diametrically opposed transducers; thus, when probe 3 is displaced from its reference location, there is an imbalance in one or both of the transistor pairs, causing the drain voltages to become unequal. Parallel diodes 24, 25 or 26, 27 connect the highest drain voltage to the output at point A, which gives an indication of the amplitude of the force used. Potentiometers connected to one of the gates of each differential pair are used to balance the circuits when no external forces are applied.

Figure 3:
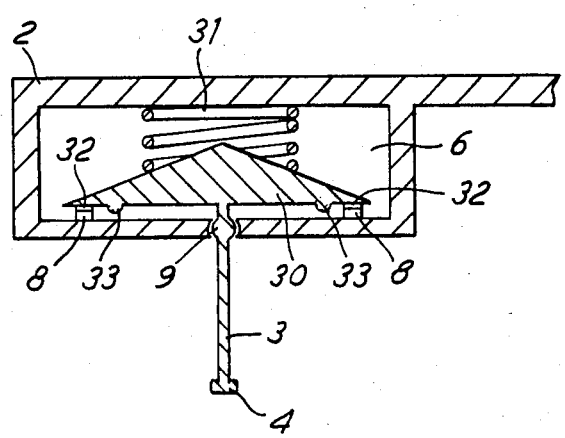
FIG. 3 is a cross-sectional view of another form of sensing apparatus embodying the present invention.
Figure 3:
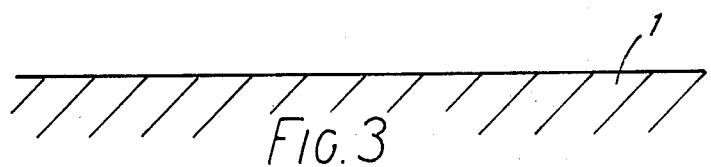

FIG. 3 shows another form of sensor for use in part of a programmable manipulator; those features of the sensor in FIG. 3 which are identical to that of FIG. 1 are given the same reference numerals. The primary distinction of the sensor of FIG. 3 is that it has provision for measurement of movement of the probe 3 in a direction parallel to its longitudinal axis.

The probe 3 has a conical element 30 at that end which is retained within the space 6 of arm 2, a spring 31 acting on this conical element 30 in order to provide a return force against displacements of the probe 3. Moreover the transducers 32 monitor the separation between the base surface of conical element 30 and a surface of the arm 2 which is between the element 30 and the probe's free end.

The element 30 has a number of stops 33 to limit the approach of element 30 to the adjacent face of space 6 in order to protect the transducers.

Figure 4:
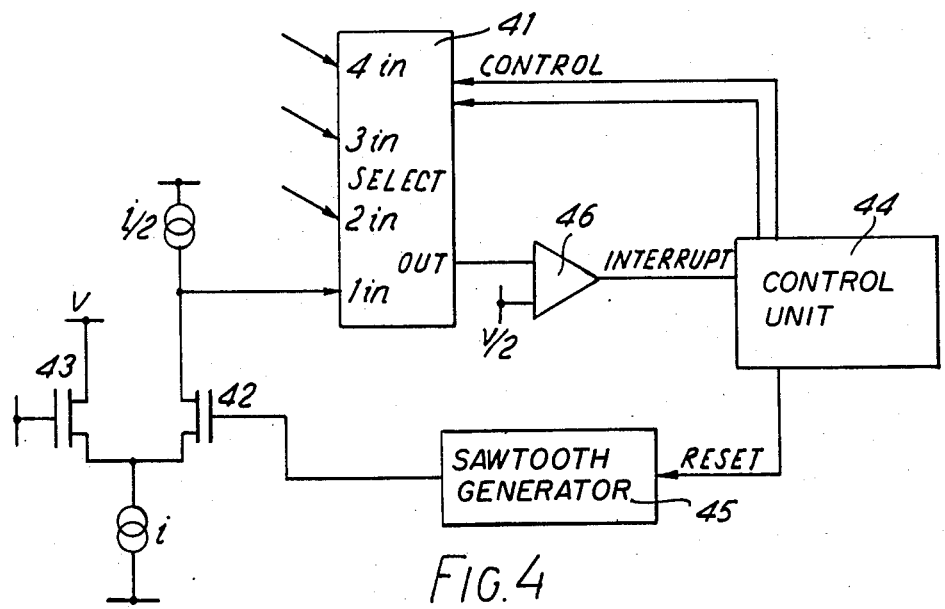
FIG. 4 is a diagram of an electric circuit for use with the apparatus of FIG. 3.

One form of electrical circuit suitable for use with the apparatus of FIG. 3 is shown in FIG. 4. Each of the transducers 7 is a monolithic differential pair of MISFETs, one of which has an elastomeric dielectric layer and hence is sensitive to any applied force, and the other of which has no such elastomeric layer and therefore is not sensitive to such force; in this way the two sets of outputs can be used to cancel out the effect of temperature drifts.

The circuit shown in FIG. 4 enables the deduction of the force applied to each MISFET pair and then the computation of the amplitude and angle of the external disturbing force. Only one of the four MISFET pairs 40 is shown, the others being connected to the other inputs of a selector 41; the MISFET pair shown consists of one MISFET 42 which is sensitive to applied forces, and one MISFET 43 which isn't sensitive to applied forces.

To measure the force applied to the MISFET pair 40, a control unit 44 resets and triggers a sawtooth generator 45, which applies a rising sawtooth signal pulse to the gate of MISFET 42. The control unit 44 then exits into a counting loop, and counts cycles until it is interrupted by a comparator 46 switching over, which happens when MISFETs 42 and 43 are balanced. The number of counts before the interrupt is dependent in a simple relationship to the voltage applied to the gate of MISFET 42, which in turn is a function of the force applied to the MISFET pair 40. By using measurements derived in the initial calibration of the equipment, the control unit 44 can compute the force applied to the MISFET pair 40.

Then this operation is repeated for each of the other MISFET pairs in order to obtain the respective values of force applied to each pair. Once all these values have been stored, the control unit 44 computes the amplitude and direction of the external disturbing force which was acting on the free end 4 of the probe.

Periodically, when external disturbing forces are known to be absent, control unit 44 uses its readings to update the zero settings in order to compensate for any residual drift in the outputs of the MISFET pairs.

Clearly, the control unit 44 can operate such that, as soon as it receives the first signal from a MISFET pair indicating the application of a force there, it produces immediately an indication that the probe 3 is being disturbed; in due course the control unit 44 also produces an indication of the amplitude and direction of the displacement of the probe.

Figure 5:
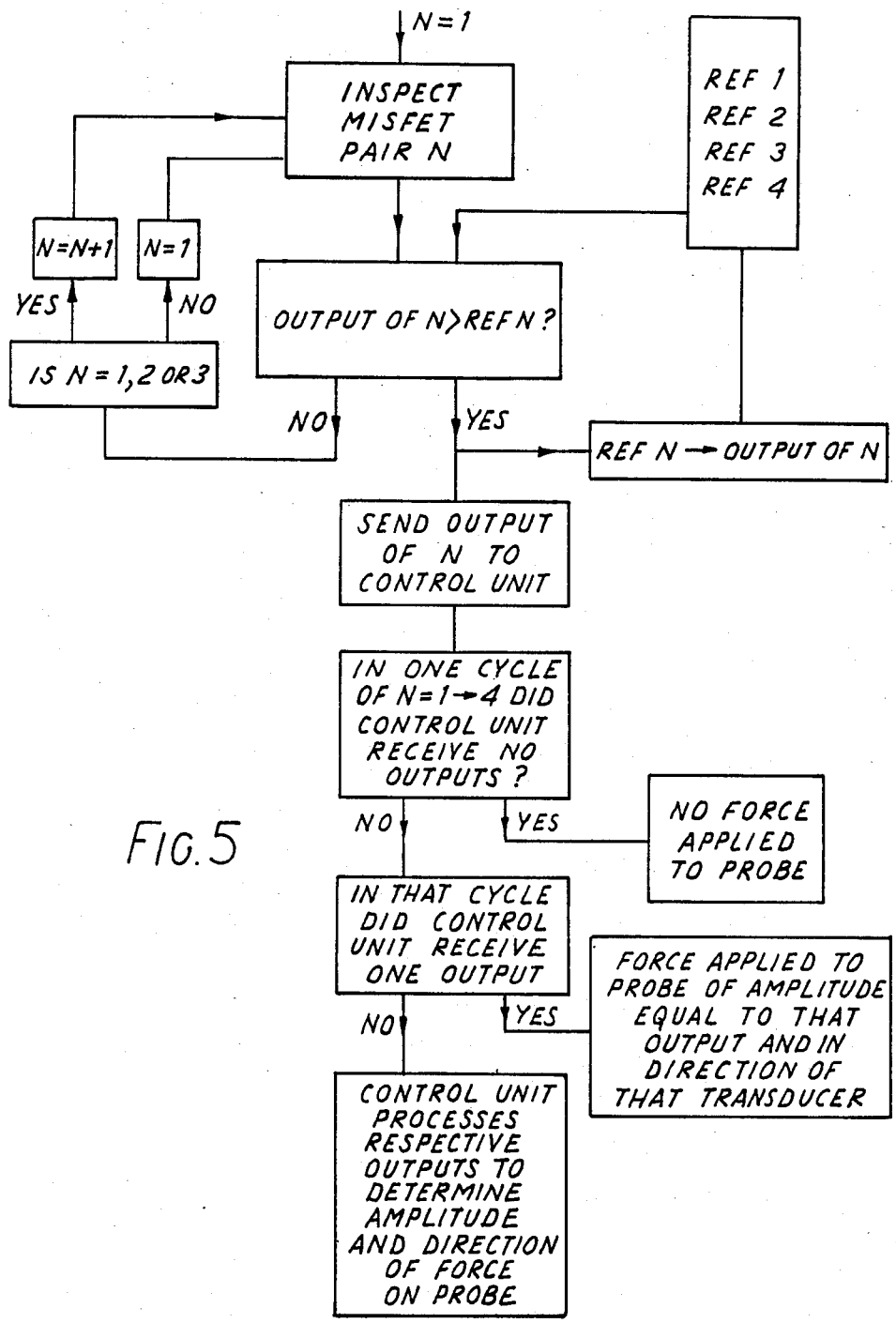
FIG. 5 is a flow diagram showing the operation of the circuit in FIG. 4.

Details of the operating steps which may be used by the electric circuit of FIG. 4 are shown in the flow diagram of FIG. 5.

Figure 6:
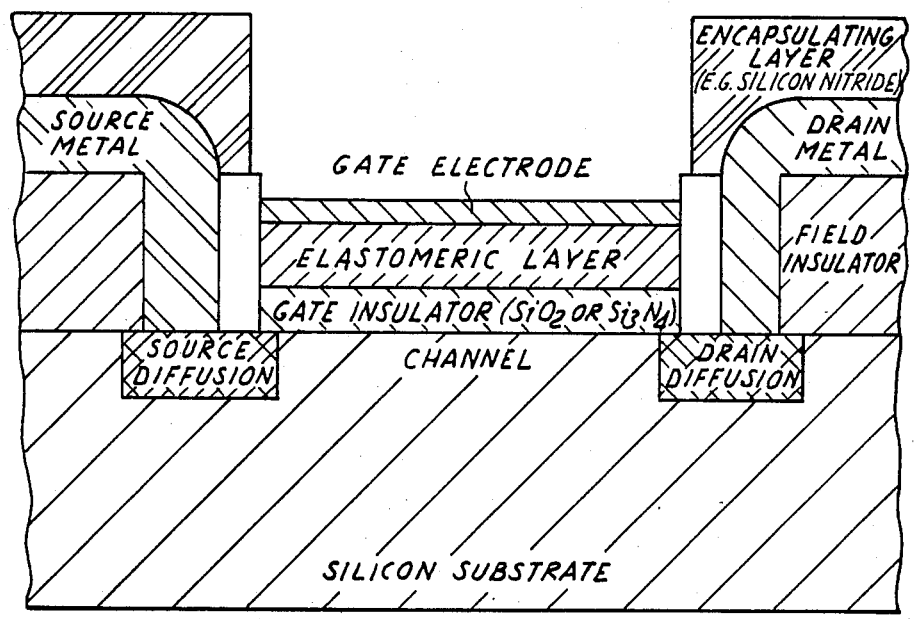
FIG. 6 is a schematic cross-section of a transducer for use in the apparatus of FIG. 1 or of FIG. 3.

The capacitative transducers used in either of the above forms of the invention may be of an appropriate type. Advantageously they have the features disclosed and claimed in U.S. patent application Ser. No. 714,923 filed Mar. 22, 1985. One specific form of such a transducer is shown schematically in FIG. 6.

We claim:

1. An apparatus for sensing contact with an article, the apparatus comprising a support member, a probe displaceable with respect to the support member and to a reference position in response to contact with an article, and three or more pressure sensitive capacitative transducers arranged in spaced apart relationship between the support member and the probe,
   wherein each said pressure sensitive capacitative transducer includes an elastomeric dielectric material and is capable of producing a detectable electrical signal in response to a displacement of the probe from the reference position.

2. A sensing apparatus according to claim 1 wherein the transducers are mounted on a common surface of the probe.

3. A sensing apparatus according to claim 2 wherein the transducers are mounted on a planar surface orthogonal to the longitudinal axis of the probe.

4. A sensing apparatus according to claim 3 wherein the transducers are spaced apart from one another at regular intervals around the longitudinal axis.

5. A sensing apparatus according to claim 3 including means to allow displacement of the probe, in relation to the support along said longitudinal axis.

6. A sensing apparatus according to claim 5 including resilient means to resist displacement along the longitudinal axis.

7. A sensing apparatus according to Claim 1 including a processing circuit responsive to electrical signals produced simultaneously by the transducer to evaluate the direction and/or extent of probe displacement with respect to said reference position.

8. A sensing apparatus according to claim 1 wherein each said capacitative transducer comprises a field effect transistor device provided with an elastomeric dielectric material between the gate insulator and the gate electrode of the device.

9. An article-handling equipment comprising a work station at which an article can be held, an apparatus for sensing contact with the article, the apparatus comprising a support member, a probe displaceable with respect to the support member and to a reference position in response to contact with the article,
   and three or more pressure sensitive capacitative transducers arranged in spaced apart relationship between the support and the probe,
   wherein each said pressure sensitive capacitative transducer includes an elastomeric dielectric material and is capable of producing a detectable electrical signal in response to a displacement of the probe from the reference position,
   and control means to cause relative movement of the probe and article in dependence in electrical signals produced by one or more of the transducers.

10. An article-handling equipment according to claim 9 wherein said control means is effective to cause the probe to return to the reference position.

* * * * *